(12) United States Patent
Hsieh et al.

(10) Patent No.: US 12,543,581 B2
(45) Date of Patent: Feb. 3, 2026

(54) FLIP-CHIP BONDING STRUCTURE AND SUBSTRATE THEREOF

(71) Applicant: CHIPBOND TECHNOLOGY CORPORATION, Hsinchu (TW)

(72) Inventors: Chin-Tang Hsieh, Kaohsiung (TW); Lung-Hua Ho, Hsinchu (TW); Chih-Ming Kuo, Hsinchu County (TW); Chun-Ting Kuo, Kaohsiung (TW); Yu-Hui Hu, Pingtung County (TW); Chih-Hao Chiang, Hsinchu County (TW); Chen-Yu Wang, Hsinchu (TW); Kung-An Lin, Hsinchu (TW); Pai-Sheng Cheng, Hsinchu (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 499 days.

(21) Appl. No.: 18/109,337

(22) Filed: Feb. 14, 2023

(65) Prior Publication Data
US 2023/0378044 A1 Nov. 23, 2023

(30) Foreign Application Priority Data
May 19, 2022 (TW) .................................. 111118656

(51) Int. Cl.
*H01L 23/498* (2006.01)
*H01L 23/00* (2006.01)

(52) U.S. Cl.
CPC ........ *H01L 23/49838* (2013.01); *H01L 24/13* (2013.01); *H01L 24/16* (2013.01);
(Continued)

(58) Field of Classification Search
CPC ................................................. H01L 23/49838
See application file for complete search history.

(56) References Cited

U.S. PATENT DOCUMENTS

| 5,519,580 A | 5/1996 | Natarajan et al. |
| 6,201,305 B1 * | 3/2001 | Darveaux .............. H05K 1/111 |
| | | 257/781 |

(Continued)

FOREIGN PATENT DOCUMENTS

| JP | 2000-31630 A | 1/2000 |
| JP | 2007-317842 A | 12/2007 |

(Continued)

OTHER PUBLICATIONS

Japanese Office Action mailed Jan. 23, 2024 for Japanese Patent Application No. 2023-021934, 2 pages.
(Continued)

*Primary Examiner* — William A Harriston
(74) *Attorney, Agent, or Firm* — Demian K. Jackson; Jackson IPG PLLC

(57) ABSTRACT

A flip-chip bonding structure includes a substrate and a chip. A lead of the substrate includes a body, a hollow opening, a bonding island and at least one connecting bridge. The hollow opening is in the body and surrounded by the body. The bonding island is located in the hollow opening such that there is a hollow space in the hollow opening and located between the body and the bonding island. The connecting bridge is located in the hollow space to connect the body and the bonding island. A bump of the chip is bonded to the bonding island by a solder. The solder is restricted on the bonding island and separated from the body by the hollow space so as to avoid the solder from overflowing to the body and avoid the chip from shifting.

10 Claims, 7 Drawing Sheets

(52) U.S. Cl.
CPC ............... *H01L 2224/13014* (2013.01); *H01L 2224/16227* (2013.01)

(56) References Cited

U.S. PATENT DOCUMENTS

| | | | | |
|---|---|---|---|---|
| 2008/0093749 A1* | 4/2008 | Gerber | ................... | H05K 1/111 |
| | | | | 257/784 |
| 2013/0113094 A1* | 5/2013 | Wu | ....................... | H01L 23/291 |
| | | | | 257/737 |
| 2014/0168909 A1* | 6/2014 | Zheng | ................. | H05K 3/3452 |
| | | | | 361/728 |
| 2015/0348923 A1* | 12/2015 | Wang | ................. | H01L 23/3171 |
| | | | | 257/774 |

FOREIGN PATENT DOCUMENTS

| | | |
|---|---|---|
| JP | 2020-57725 A | 4/2020 |
| TW | 202133370 A | 9/2021 |

OTHER PUBLICATIONS

1 Taiwanese Office Action mailed Jan. 11, 2023 for Taiwanese Patent Application No. 111118656, 9 pages.

\* cited by examiner

FLIP-CHIP BONDING STRUCTURE AND SUBSTRATE THEREOF

FIELD OF THE INVENTION

This invention relates to a flip-chip bonding structure and its substrate, and more particularly to a flip-chip bonding structure and its substrate which can prevent a bump from sliding or shifting caused by solder overflow.

BACKGROUND OF THE INVENTION

A conventional flip-chip bonding structure 10 shown in FIGS. 1 and 2 includes a substrate 11 and a chip 12, bumps 12a of the chip 12 are bonded to a lead 11a of the substrate 11 by a solder 12b. The chip 12 and the bumps 12a are not shown in the partial enlarged drawing of FIG. 1 in order to explain the situation of the solder 12b bonded to the lead 11a of the substrate 11. If the lead 11a is a ground lead or it requires an increased bonding surface 11b for electrical requirement, the bonding surface 11b of the lead 11a is designed to be larger than a bonding surface 12c of the solder 12b. However, the solder 12b may overflow on the bonding surface 11b of the lead 11 during bonding to cause slide or shift of the bumps 12a and further cause the moved chip 12 to be bonded to the substrate 11 incorrectly, and the solder 12b overflowing on the bonding surface 11b also may contaminate the lead 11a or bridge the adjacent leads. Moreover, the overall height of the substrate 11 and the chip 12 after bonding cannot be controlled well owing to the solder 12b overflowing on the bonding surface 11b.

SUMMARY

One object of the present invention is to provide a flip-chip bonding structure and its substrate. A hollow opening, a bonding island and at least one connecting bridge are provided on a body of a lead, the body and the bonding island are separated by a hollow space of the hollow opening, and a solder on a bump is restricted on the bonding island when the bump is bonded to the bonding island. Thus, it is possible to avoid the problems of bump sliding, solder contamination, bridge of the adjacent leads or insufficient bonding height.

A flip-chip bonding structure of the present invention includes a chip and a substrate which includes a carrier and at least one lead. The lead is located on the carrier and includes a body, a hollow opening, a bonding island and a first connecting bridge. The hollow opening is in the body and surrounded by the body, the bonding island is located in the hollow opening such that there is a hollow space in the hollow opening and located between the body and the bonding island. The first connecting bridge is located in the hollow space and its both ends are connected to the bonding island and the body respectively to allow the bonding island to be electrically connected to the body. The chip includes at least one bump and a solder and is bonded to a bonding surface of the bonding island by the solder located on the bump. A gap exists between a side surface of the solder and an inner side surface of the hollow opening.

A substrate of a flip-chip bonding structure of the present invention includes a carrier and at least one lead which is located on the carrier and includes a body, a hollow opening, a bonding island and a first connecting bridge. The hollow opening is in the body and surrounded by the body, the bonding island provided to bond to at least one bump of a chip is located in the hollow opening such that there is a hollow space in the hollow opening and located between the body and the bonding island. The first connecting bridge is located in the hollow space and its both ends are connected to the bonding island and the body respectively to allow the bonding island to be electrically connected to the body.

In the present invention, the solder on the bonding island is separated from the body by the hollow space located between the body and the bonding island such that the solder is restricted on the bonding island to avoid overflow of the solder.

DETAILED DESCRIPTION OF THE INVENTION

Figure 1:
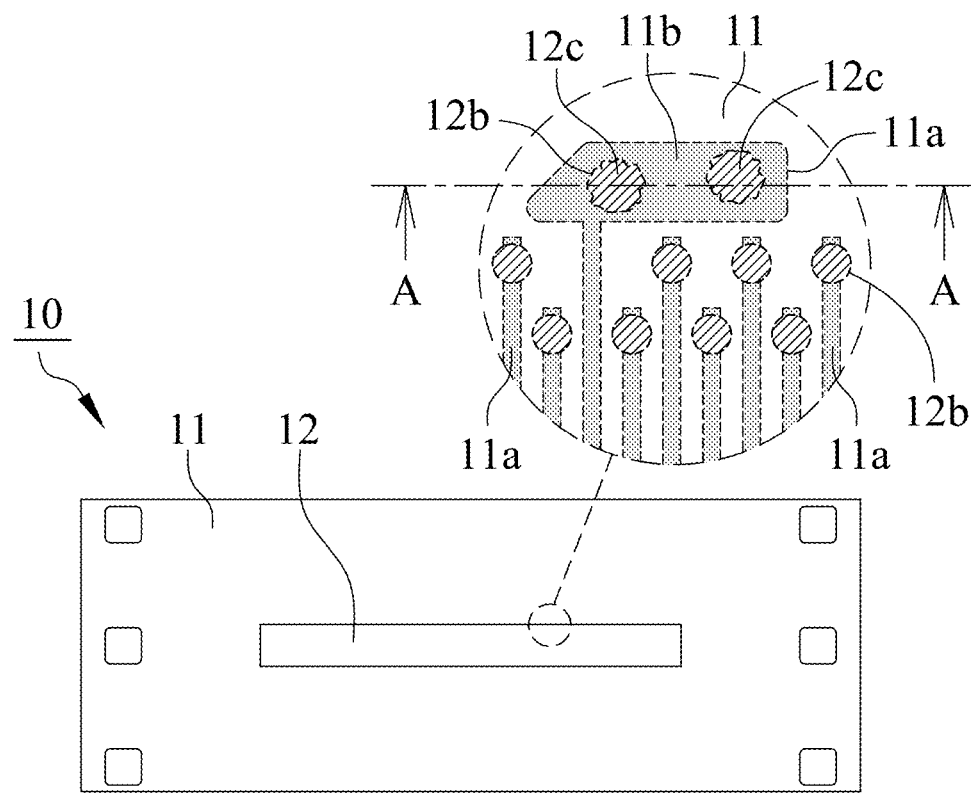
FIG. 1 is a top view diagram illustrating a conventional flip-chip binding structure.
Figure 2:
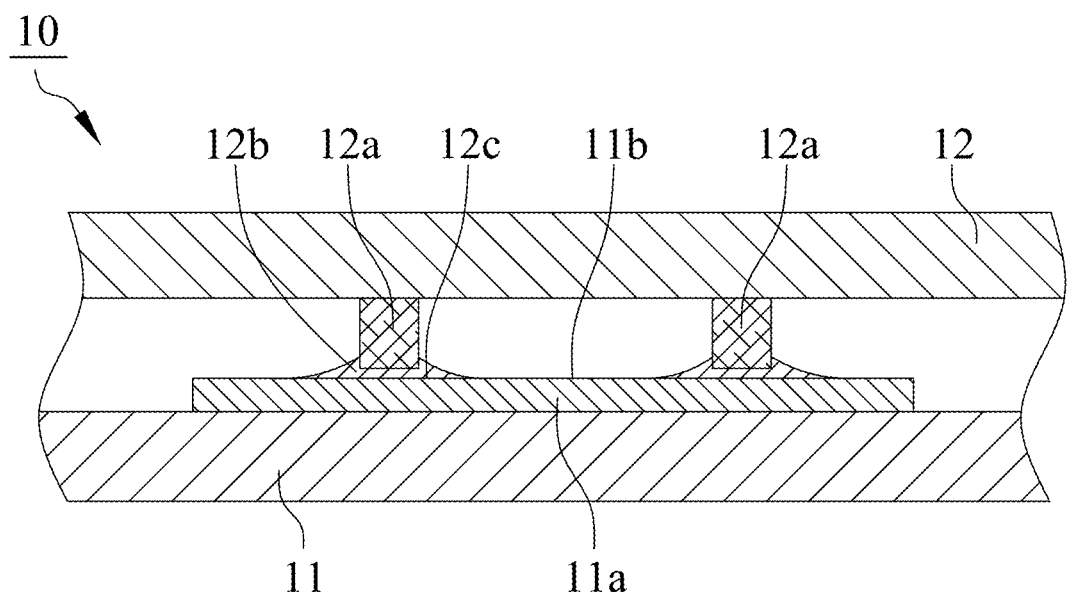
FIG. 2 is a cross-section view diagram along A-A line of FIG. 1.

A flip-chip bonding structure 100 in accordance with a first embodiment of the present invention is represented in FIGS. 3 to 7. The flip-chip bonding structure 100 includes a substrate 110 and a chip 120, the substrate 110 includes a carrier 111 and at least one lead 112 located on the carrier 111, the chip 120 includes at least one bump 121 and a solder 122 and is bonded to the lead 112 by the solder 122 located on the bump 121.

Figure 3:
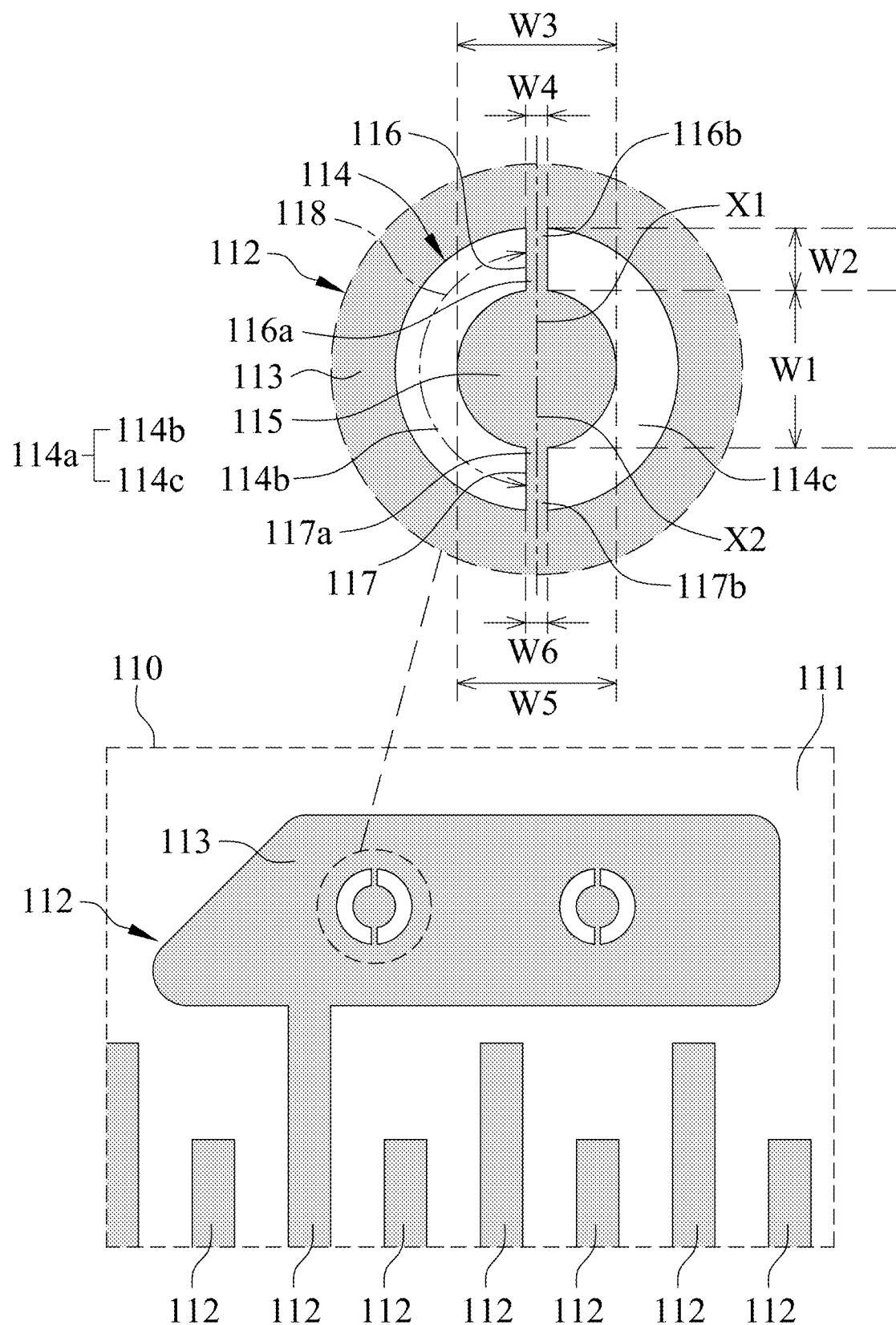
FIG. 3 is a top view diagram illustrating a part of a substrate of a flip-chip bonding structure in accordance with a first embodiment of the present invention.

With reference to FIG. 3, the lead 112, may be a ground lead or a signal lead with increased bonding surface for electrical requirement, includes a body 113, a hollow opening 114, a bonding island 115 and a first connecting bridge 116. The hollow opening 114 is located in the body 113 and surrounded by the body 113, and in this embodiment, the carrier 111 is visible from the hollow opening 114. The bonding island 115, whose shape may be circular, oval, triangle, square or polygon, is arranged in the hollow opening 114 such that there is a hollow space 114a in the hollow opening 114 and located between the body 113 and the bonding island 115. The first connecting bridge 116 is located in the hollow space 114a and its both ends, a first end 116a and a second end 116b, are connected to the bonding island 115 and the body 113, respectively, to allow the bonding island 115 to be electrically connected to the body 113.

With reference to FIG. 3, the lead 112 of the first embodiment further includes a second connecting bridge 117 which is also located in the hollow space 114a. There is an included angle 118 between the first connecting bridge 116 and the second connecting bridge 117, and the included angle 118 can be less than, equal to or greater than 90 degrees. Both ends, a third end 117a and a fourth end 117b, of the second connecting bridge 117 are connected to the bonding island 115 and the body 113, respectively. Because of the first connecting bridge 116 and the second connecting bridge 117, the hollow space 114a is divided into a first hollow portion 114b and a second hollow portion 114c. The first connecting bridge 116 and the second connecting bridge 117 are located between the first hollow portion 114a and the second hollow portion 114c, respectively.

With reference to FIG. 3, a first axis X1 passes through the bonding island 115 and the first connecting bridge 116, and a second axis X2 passes through the bonding island 115 and the second connecting bridge 117. In a direction parallel to the first axis X1, the width of the bonding island 115 is referred to as a first width W1, the width of the hollow space 114a located between the body 113 and the bonding island 115 is referred to as a second width W2, the second width W2 is not greater than the first width W1, and preferably, the second width W2 is less than the first width W1. In a direction perpendicular to the first axis X1, the width of the bonding island 115 is referred to as a third width W3, the width of the first connecting bridge 116 is referred to as a fourth width W4, and the fourth width W4 is less than the third width W3. In a direction perpendicular to the second axis X2, the width of the bonding island 115 is referred to as a fifth width W5, the width of the second connecting bridge 117 is referred to as a sixth width W6, and the sixth width W6 is less than the fifth width W5.

Figure 4:
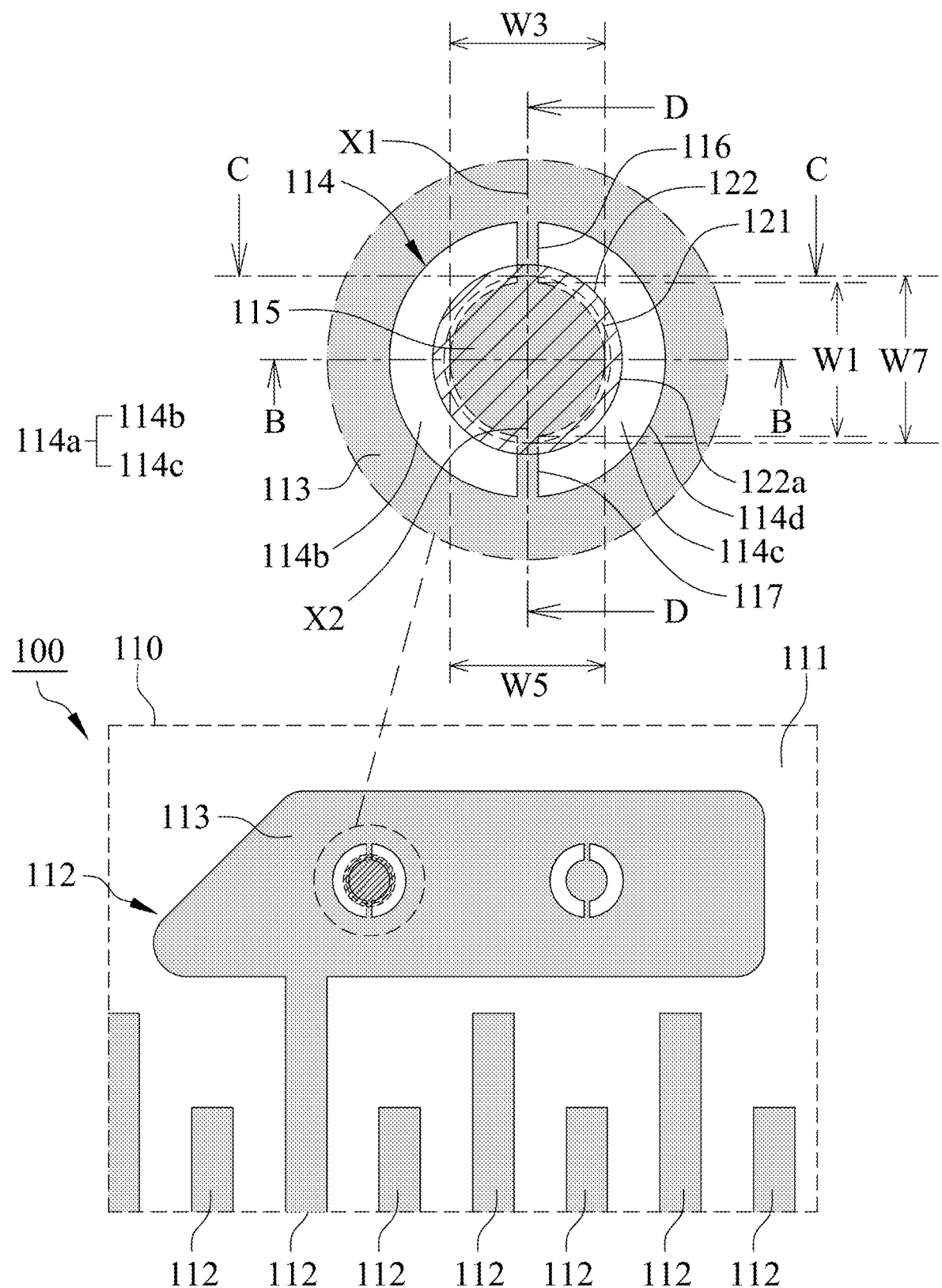
FIG. 4 is a top view diagram illustrating a part of a flip-chip bonding structure in accordance with a first embodiment of the present invention.
Figure 5:
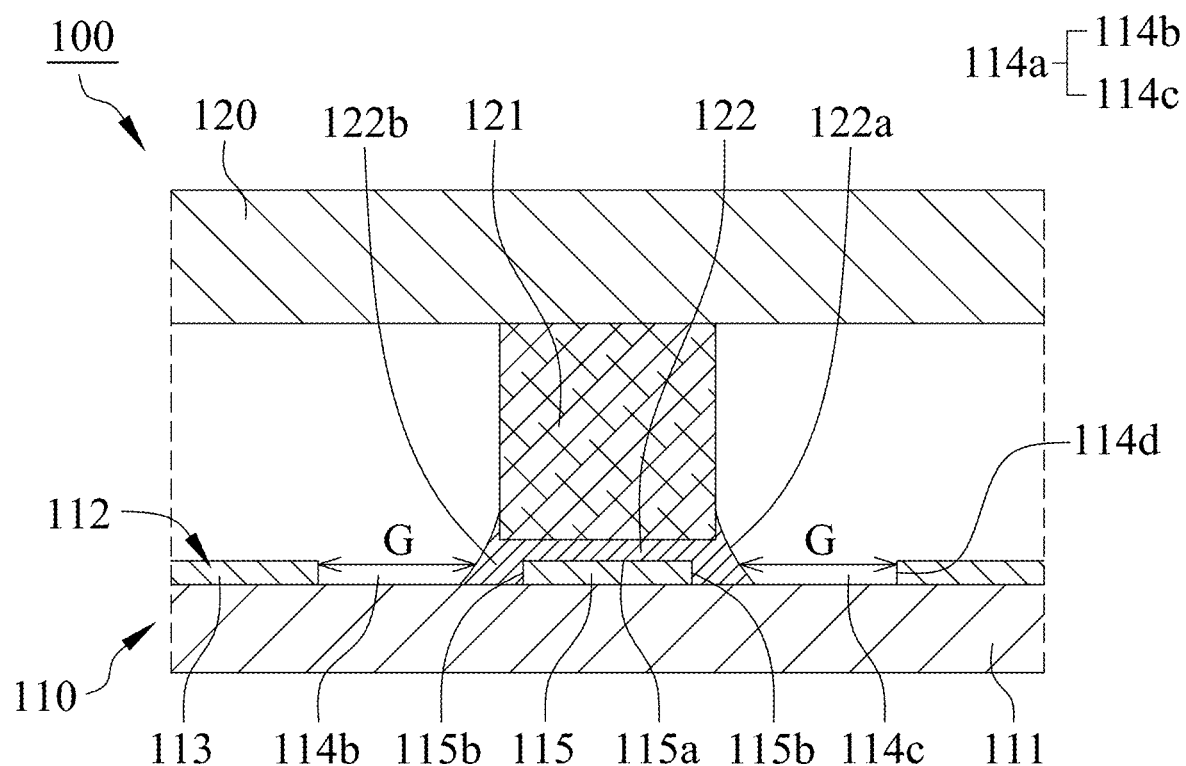
FIG. 5 is a cross-section view diagram along B-B line of FIG. 4.
Figure 6:
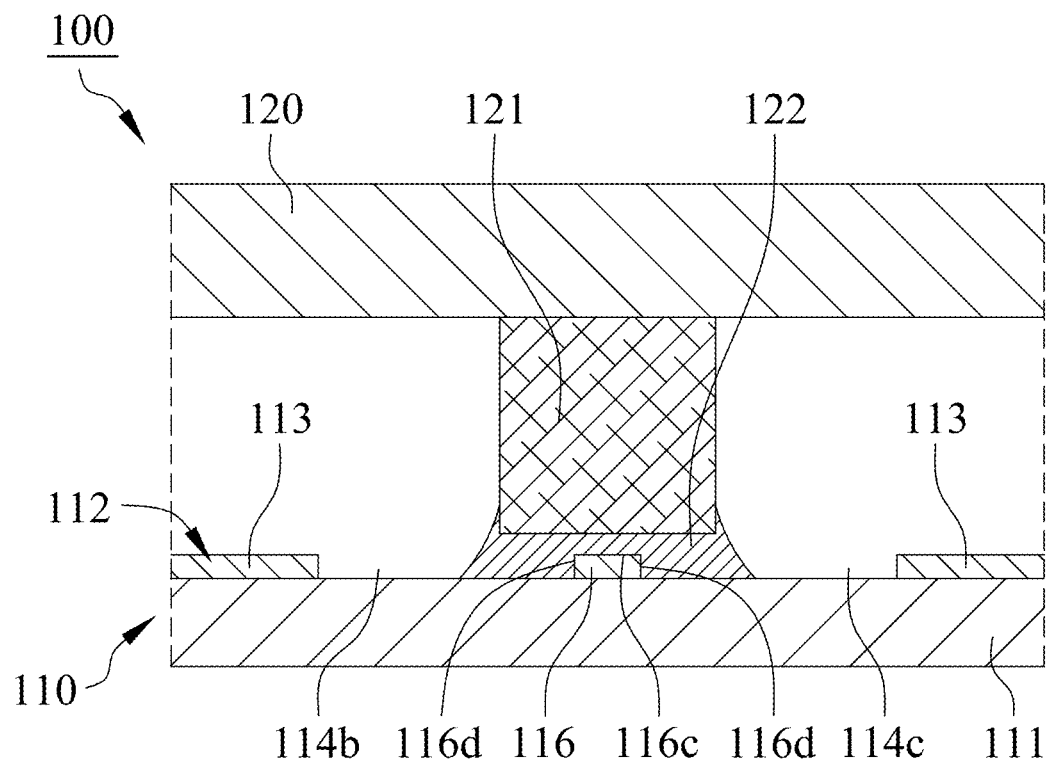
FIG. 6 is a cross-section view diagram along C-C line of FIG. 4.
Figure 7:
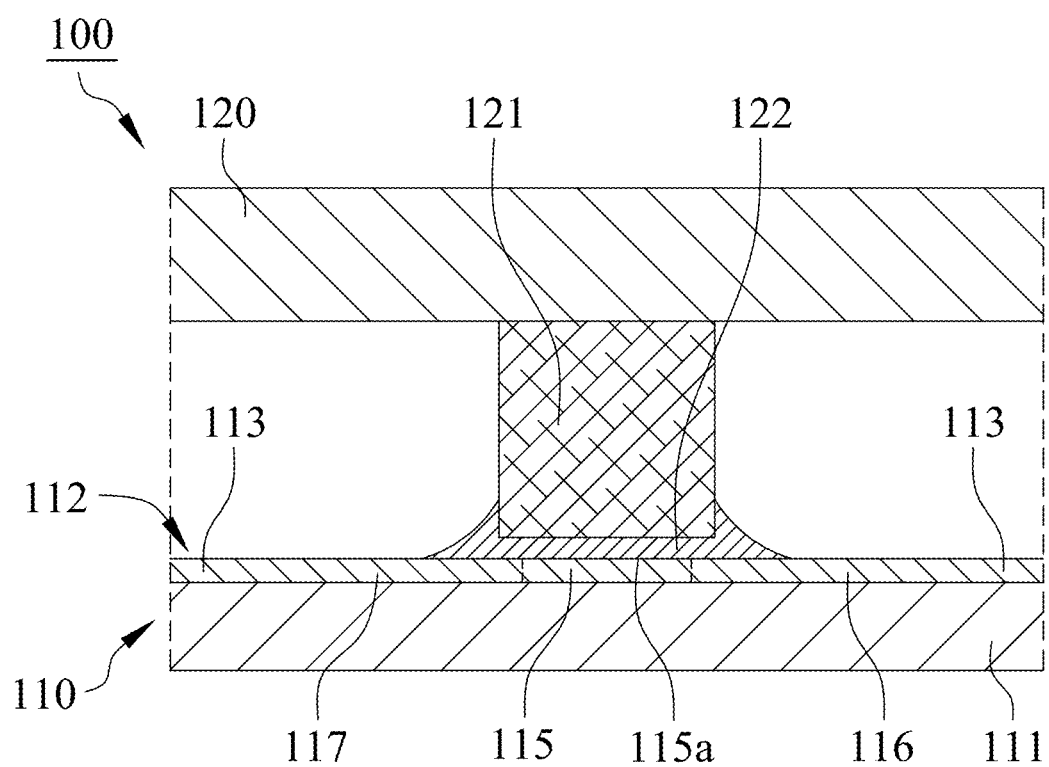
FIG. 7 is a cross-section view diagram along D-D line of FIG. 4.

In order to show the bump 121 which is bonded to the bonding island 115 by the solder 122, the chip 120 is omitted in the FIG. 4. Referring to FIGS. 4, 5 and 7, the bump 121 of the chip 120 is bonded to a bonding surface 115a of the bonding island 115 by the solder 122 located on the bump 121, and a gap exists between a side surface 122a of the solder 122 and an inner side surface 114d of the hollow opening 114. Because of the hollow space 114a, the solder 122 is separated from the body 113 to prevent the solder 122 from overflowing to the body 113. In this embodiment, the width of the bump 121 in the direction parallel to the first axis X1, parallel to the second axis X2, perpendicular to the first axis X1 or perpendicular to the second axis X2 is referred to as a width W7, and preferably, the first width W1, the third width W3 and/or the fifth width W5 of the bonding island 115 is less than the width W7 of the bump 121. Accordingly, a side portion 122b of the solder 122 can cover a side surface 115b of the bonding island 115, and the solder 122 can be stably adhered to the bonding island 115 to prevent the bump 121 from sliding or shifting. With reference to FIGS. 4 and 6, the solder 122 preferably further covers a top surface 116c and a side surface 116d of the first end 116a of the first connecting bridge 116 to increase the bonding area between the solder 122 and the bonding island 115. In this embodiment, the side portion 122b of the solder pater 122 is accommodated in the hollow space 114a. Because the hollow space 114a is provided between the body 113 and the bonding island 115, the side portion 122b of the solder 122 is separated from the body 113 to prevent the solder 122 from overflowing to the body 113.

Figure 8:
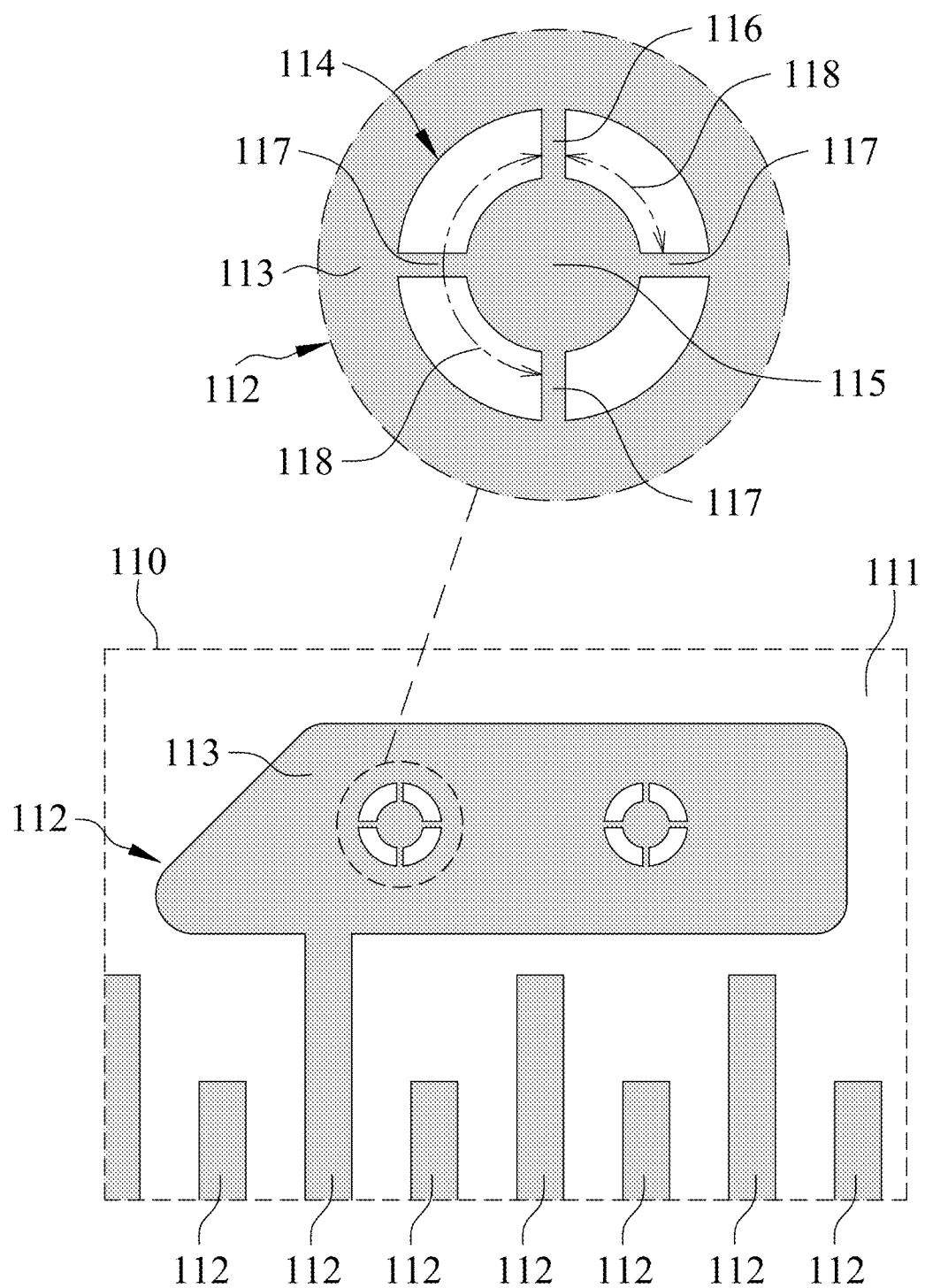
FIG. 8 is a top view diagram illustrating a part of a substrate of a flip-chip bonding structure in accordance with a second embodiment of the present invention.
Figure 9:
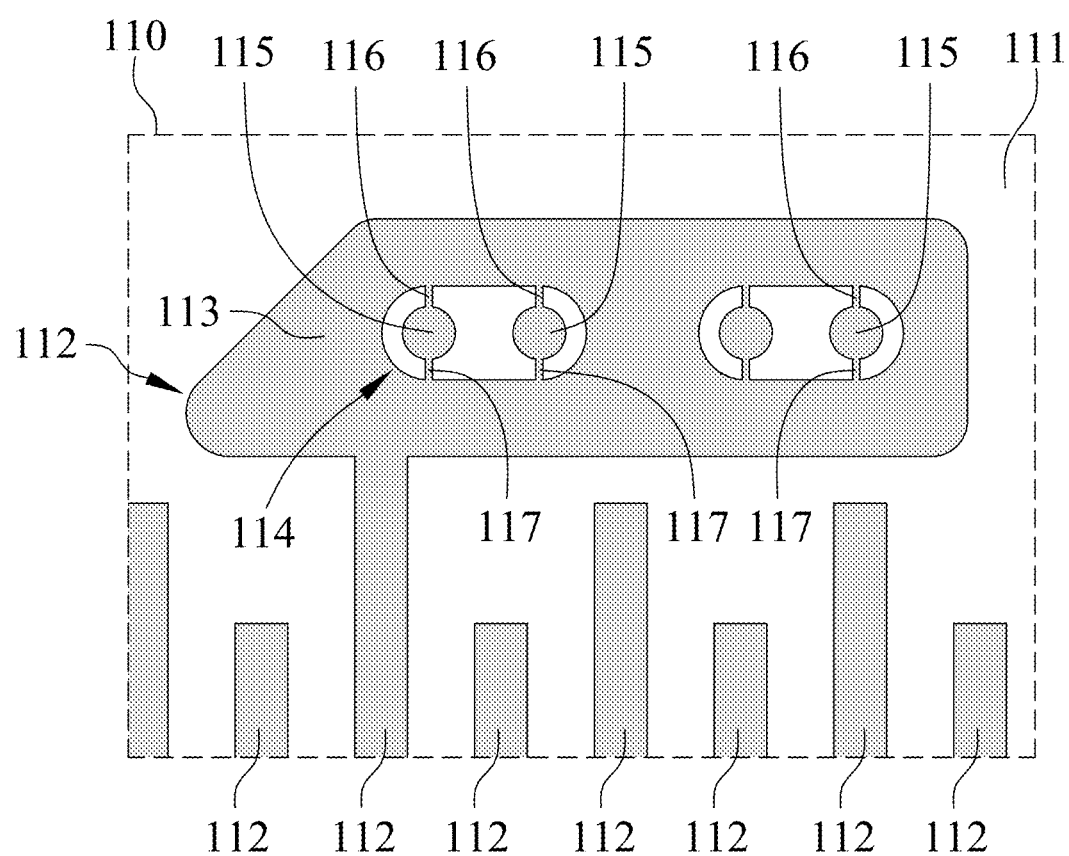
FIG. 9 is a top view diagram illustrating a part of a substrate of a flip-chip bonding structure in accordance with a third embodiment of the present invention.

A second embodiment of the present invention is shown in FIG. 8. Different to the first embodiment, the lead 112 of the second embodiment includes a plurality of second connecting bridges 117, the third end 117a and the fourth end 117b of each of the second connecting bridges 117 are connected to the bonding island 115 and the body 113, respectively. There is an included angle 118 between the first connecting bridge 116 and each of the second connecting bridges 117. With reference to FIG. 9 which shows a third embodiment of the present invention, the difference between the first and third embodiments is that the lead 112 includes a plurality of bonding islands 115, a plurality of first connecting bridges 116 and a plurality of second connecting bridges 117 in the third embodiment. The bonding islands 115 are located in the hollow opening 114, a gap exists between the adjacent bonding islands 115. The first end 116a and the second end 116b of each of the first connecting bridges 116 are connected to the corresponding bonding island 115 and the body 113, respectively. And the third end 117a and the fourth end 117b of each of the second connecting bridges 117 are connected to the corresponding bonding island 115 and the body 113, respectively.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A flip-chip bonding structure comprising:
   a substrate including a carrier and at least one lead disposed on the carrier, the at least one lead includes a body, a hollow opening, a bonding island and a first connecting bridge, the hollow opening is located in the body and surrounded by the body, the bonding island is located in the hollow opening such that there is at least one hollow space located in the hollow opening and located between the body and the bonding island, the first connecting bridge is located in the at least one hollow space, a first end of the first connecting bridge is connected to the bonding island and a second end of the first connecting bridge is connected to the body to allow the bonding island to be electrically connected to the body; and
   a chip including at least one bump and a solder, the chip is bonded to a bonding surface of the bonding island by the solder located on the at least one bump, there is a gap between a side surface of the solder and an inner side surface of the hollow opening, wherein a side surface of the bonding island is covered by a side portion of the solder, the side portion of the solder is located in the at least one hollow space, and the side portion of the solder is separated from the body by the at least one hollow space.

2. The flip-chip bonding structure in accordance with claim 1, wherein a first axis passes through the bonding island and the first connecting bridge, the at least one bump has a width and the bonding island has a first width in a direction parallel to the first axis, the first width of the bonding island is less than the width of the at least one bump.

3. The flip-chip bonding structure in accordance with claim 1, wherein a first axis passes through the bonding island and the first connecting bridge, the bonding island has a first width and the at least one hollow space located between the body and the bonding island has a second width in a direction parallel to the first axis, the second width of the at least one hollow space is less than or equal to the first width of the bonding island.

4. The flip-chip bonding structure in accordance with claim 1, wherein a first axis passes through the bonding island and the first connecting bridge, the bonding island has a third width and the first connecting bridge has a fourth width in a direction perpendicular to the first axis, the fourth width of the first connecting bridge is less than the third width of the bonding island.

5. The flip-chip bonding structure in accordance with claim 4, wherein the at least one lead further includes at least one second connecting bridge located in the at least one hollow space, a third end of the at least one second connecting bridge is connected to the bonding island and a fourth end of the at least one second connecting bridge is connected to the body such that the at least one hollow space is divided into a first hollow portion and a second hollow portion, there is an included angle between the first connecting bridge and the at least one second connecting bridge, and the first connecting bridge and the at least one second connecting bridge are located between the first hollow portion and the second hollow portion, respectively.

6. The flip-chip bonding structure in accordance with claim 5, wherein a second axis passes through the bonding island and the at least one second connecting bridge, the bonding island has a fifth width and the at least one second connecting bridge has a sixth width in a direction perpendicular to the second axis, the sixth width of the at least one second connecting bridge is less than the fifth width of the bonding island.

7. The flip-chip bonding structure in accordance with claim 1, wherein the at least one lead further includes at least one second connecting bridge located in the at least one hollow space, a third end of the at least one second connecting bridge is connected to the bonding island and a fourth end of the at least one second connecting bridge is connected to the body such that the at least one hollow space is divided into a first hollow portion and a second hollow portion, there is an included angle between the first connecting bridge and the at least one second connecting bridge, and the first connecting bridge and the at least one second connecting bridge are located between the first hollow portion and the second hollow portion, respectively.

8. The flip-chip bonding structure in accordance with claim 7, wherein a second axis passes through the bonding island and the at least one second connecting bridge, the bonding island has a fifth width and the at least one second connecting bridge has a sixth width in a direction perpendicular to the second axis, the sixth width of the at least one second connecting bridge is less than the fifth width of the bonding island.

9. The flip-chip bonding structure in accordance with claim 1, wherein the hollow opening exposes the carrier.

10. The flip-chip bonding structure in accordance with claim 1, wherein a top surface and a side surface of the first end of the first connecting bridge are covered by the solder.

* * * * *